(12) United States Patent
Soeta et al.

(10) Patent No.: US 9,885,122 B2
(45) Date of Patent: Feb. 6, 2018

(54) METHOD OF MANUFACTURING SILICON SINGLE CRYSTAL

(71) Applicant: SHIN-ETSU HANDOTAI CO., LTD., Tokyo (JP)

(72) Inventors: Satoshi Soeta, Fukui (JP); Shinji Nakano, Minami-echizen-cho (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 286 days.

(21) Appl. No.: 14/428,901

(22) PCT Filed: Nov. 11, 2013

(86) PCT No.: PCT/JP2013/006608
§ 371 (c)(1),
(2) Date: Mar. 17, 2015

(87) PCT Pub. No.: WO2014/091671
PCT Pub. Date: Jun. 19, 2014

(65) Prior Publication Data
US 2015/0275392 A1 Oct. 1, 2015

(30) Foreign Application Priority Data

Dec. 11, 2012 (JP) ................................. 2012-270562

(51) Int. Cl.
*C30B 15/02* (2006.01)
*C30B 15/22* (2006.01)
(Continued)

(52) U.S. Cl.
CPC .............. *C30B 15/22* (2013.01); *C30B 15/04* (2013.01); *C30B 15/305* (2013.01); *C30B 15/36* (2013.01); *C30B 29/06* (2013.01); *C30B 30/04* (2013.01)

(58) Field of Classification Search
CPC ................................ C30B 15/02; C30B 15/04
See application file for complete search history.

(56) References Cited

U.S. PATENT DOCUMENTS

| 5,578,284 A | 11/1996 | Chandrasekhar et al. |
| 6,241,818 B1 | 6/2001 | Kimbel et al. |
| (Continued) | | |

FOREIGN PATENT DOCUMENTS

| CN | 1148103 A | 4/1997 |
| CN | 1350602 A | 5/2002 |
| (Continued) | | |

OTHER PUBLICATIONS

Oct. 10, 2016 Office Action issued in Chinese Patent Application No. 201380064654.4.
(Continued)

*Primary Examiner* — Robert M Kunemund
(74) *Attorney, Agent, or Firm* — Oliff PLC

(57) ABSTRACT

The invention provides a method of manufacturing an N-type silicon single crystal having a resistivity of 0.05 Ωcm or less and a crystal orientation of <100> by a Czochralski method, including: bringing a seed crystal into contact with a melt doped with a dopant in a crucible; forming a cone while adjusting a taper angle θ such that a ratio of the total of individual lengths of areas each having a taper angle θ ranging from 25° to 45° to length L of a cone side surface is 20% or less, where θ being formed between a growth direction of the silicon single crystal and the cone side surface when the cone is seen in a diameter direction of the silicon single crystal; and successively forming a straight body. The method can inhibit the generation of dislocations during the cone formation without reducing the yield and productivity.

8 Claims, 3 Drawing Sheets

(51) Int. Cl.
*C30B 29/06* (2006.01)
*C30B 15/30* (2006.01)
*C30B 15/04* (2006.01)
*C30B 15/36* (2006.01)
*C30B 30/04* (2006.01)

(56) References Cited

U.S. PATENT DOCUMENTS

| | | | |
|---|---|---|---|
| 2002/0000188 A1* | 1/2002 | Weber | C30B 15/22 117/13 |
| 2003/0200915 A1 | 10/2003 | Kimura et al. | |
| 2005/0160966 A1 | 7/2005 | Fusegawa et al. | |
| 2006/0191469 A1 | 8/2006 | Fu et al. | |
| 2008/0245291 A1* | 10/2008 | Inami | C30B 15/00 117/19 |
| 2009/0293804 A1 | 12/2009 | Taguchi et al. | |
| 2010/0316551 A1 | 12/2010 | Baer | |
| 2012/0315428 A1 | 12/2012 | Raming et al. | |

FOREIGN PATENT DOCUMENTS

| | | |
|---|---|---|
| CN | 1646736 A | 7/2005 |
| CN | 101922041 A | 12/2010 |
| CN | 102586862 A | 7/2012 |
| JP | H092898 A | 1/1997 |
| JP | 2002020193 A | 1/2002 |
| JP | 2002/255681 A | 9/2002 |
| JP | 2006225194 A | 8/2006 |
| JP | 2009292659 A | 12/2009 |
| JP | 2010120789 A | 6/2010 |
| JP | 2011148691 A | 8/2011 |

OTHER PUBLICATIONS

Jan. 28, 2014 International Search Report issued in International Application No. PCT/JP2013/006608.

* cited by examiner

METHOD OF MANUFACTURING SILICON SINGLE CRYSTAL

TECHNICAL FIELD

The present invention relates to a method of manufacturing a single crystal by the Czochralski method (referred to as the CZ method below).

BACKGROUND ART

In recent years, demand for power MOS semiconductors has been increasing. It thus has become increasingly important to develop N-type silicon single crystal substrates that have low resistivity and are highly doped with a volatile dopant such as antimony (Sb), arsenic (As), or phosphorus (P) as substrates for use in these semiconductors. Such silicon single crystal substrates can be obtained by slicing a silicon single crystal ingot manufactured mostly by the CZ method.

The manufacture of a silicon single crystal ingot by the CZ method begins with charging of raw material such as polycrystalline silicon to a quartz crucible disposed in a chamber. After the dopant is added to the raw material, the resultant raw material is heated and melted into a melt by a heater. A seed crystal attached to a seed holder is lowered from the upper part of the chamber to bring the seed crystal into contact with the melt. The seed crystal is rotated and gradually pulled to grow a single crystal.

As shown in FIG. 3, the growth of the single crystal involves enlarging the diameter of the single crystal to a desired diameter to form a cone, and then controlling the pulling rate and the temperature of the melt to form a straight body.

It is however very difficult for the CZ method to manufacture a single crystal highly doped with the dopant, for dislocations are often generated particularly during the period from the formation of the cone to just before the formation of the straight body. This makes the production efficiency worse. In the worst case, it may be impossible to obtain a single crystal.

In view of this problem, it is known that a taper angle of the cone is increased at least in two stages during its formation in order to inhibit the generation of the dislocations (See Patent Document 1).

CITATION LIST

Patent Literature

Patent Document 1: Japanese Unexamined Patent publication (Kokai) No. 2009-292659

SUMMARY OF INVENTION

Technical Problem

As shown in FIG. 2, the taper angle described herein means an angle θ formed between the growth direction A of a silicon single crystal and the side surface of its cone 17. It is to be noted that FIG. 2 merely shows a schematic cross section of the side surface of the cone. The actual cross section of the side surface of the cone is not straight unlike the schematic cross section shown in FIG. 2. The angle θ varies at different positions in the side surface.

The above method disclosed in Patent Document 1 however cannot sufficiently inhibit the generation of dislocations when an N-type silicon single crystal having a crystal orientation of <100> and low resistivity, as described above, (particularly a resistivity of 0.05 Ωcm or less) is manufactured, and herein lies the problem.

In order to inhibit the generation of dislocations, the pulling rate may be decreased during the cone formation in an experimental manner to form a cone with a decreased taper angle. Decreasing the taper angle, however, increases the height of the cone, thereby increasing its weight to three times heavier than its normal weight. As a result, the yield and the productivity decline.

The present invention was accomplished in view of the above-described problems. It is an object of the present invention to provide a method that can manufacture an N-type silicon single crystal having low resistivity and a crystal orientation of <100> without reducing the yield and the productivity while inhibiting the generation of dislocations during the formation of a cone.

Solution to Problem

To achieve this object, the present invention provides a method of manufacturing an N-type silicon single crystal having a resistivity of 0.05 Ωcm or less and a crystal orientation of <100> by a Czochralski method, comprising: bringing a seed crystal into contact with a melt of raw material contained in a crucible, the melt being doped with a dopant; forming a cone while adjusting a taper angle θ such that a ratio of the total of individual lengths of areas each having a taper angle θ ranging from 25° to 45° to a length L of a side surface of the cone is 20% or less, the taper angle θ being formed between a growth direction of the silicon single crystal and the side surface of the cone when the cone is seen in a direction of a diameter of the silicon single crystal; and successively forming a straight body.

Such a manufacturing method can reduce an area having a taper angle θ of 35.2° in which dislocations are especially easy to be generated during the cone formation and inhibit the height of the cone from increasing, thereby reliably enabling the inhibition of the generation of dislocations without reducing the yield and the productivity.

The dopant may be any one of antimony (Sb), arsenic (As), and phosphorus (P).

In this manner, the method can obtain the N-type silicon single crystal doped with a desired dopant.

The taper angle θ is preferably adjusted by ether decreasing a pulling rate of the silicon single crystal, or changing a rotational speed of the crucible when the cone is formed.

In this manner, the method can readily adjust the taper angle θ because the pulling rate and the rotational speed can be changed with a quick response.

In the second half of the formation of the cone, the taper angle θ is preferably held at more than 45° by ether decreasing the pulling rate of the silicon single crystal, or changing the rotational speed of the crucible.

In this manner, the method can readily adjust the taper angle θ so as to achieve the above ratio and reduce the time required for the cone formation by decreasing the height of the cone, thereby enabling improvement in the yield and the productivity.

During the growth of the silicon single crystal, a horizontal magnetic field having a central magnetic field strength of 0.15 T or more may be applied to the melt.

In this manner, the method can inhibit the convection of the melt in the crucible and reduce variation in temperature of the vicinity of the crystal growth interface, thereby making it possible to keep a uniform concentration distribution of the dopant taken in the crystal. In addition, the method can inhibit the introduction of point defects in the crystal.

Advantageous Effects of Invention

The present invention is characterized by forming a cone while adjusting a taper angle θ such that a ratio of the total of individual lengths of areas each having a taper angle θ ranging from 25° to 45° to a length L is 20% or less, where the taper angle θ is formed between a growth direction of the silicon single crystal and the side surface of the cone when the cone is seen in a diameter direction of the silicon single crystal, and the length L is the length of the side surface of the cone. The invention thereby can reduce an area having a taper angle θ of 35.2°, in which dislocations are especially easy to be generated during the cone formation, and inhibit the height of the cone from increasing, thereby reliably enabling the inhibition of the generation of dislocations without reducing the yield and the productivity.

DESCRIPTION OF EMBODIMENTS

Embodiments of the present invention will be hereinafter described, but the present invention is not limited to these embodiments.

As described previously, dislocations are often generated during the formation of a cone when a highly doped N-type silicon single crystal having a crystal orientation of <100> is manufactured. The present inventors investigated this problem and consequently found that a facet frequently appears on the surface of the cone before the dislocations are generated there. It can be understood that when the facet appears, crystal growth becomes unstable at the boundary between the front of the growth and a portion grown at a constant temperature, and this is the reason for the generation of the dislocations. The inventors further considered and found that these dislocations are generated depending neither on the pulling rate nor the temperature distribution, but on the shape of the cone. In particularly, the dislocations are easy to be generated when a (111) face is formed.

Figure 3:
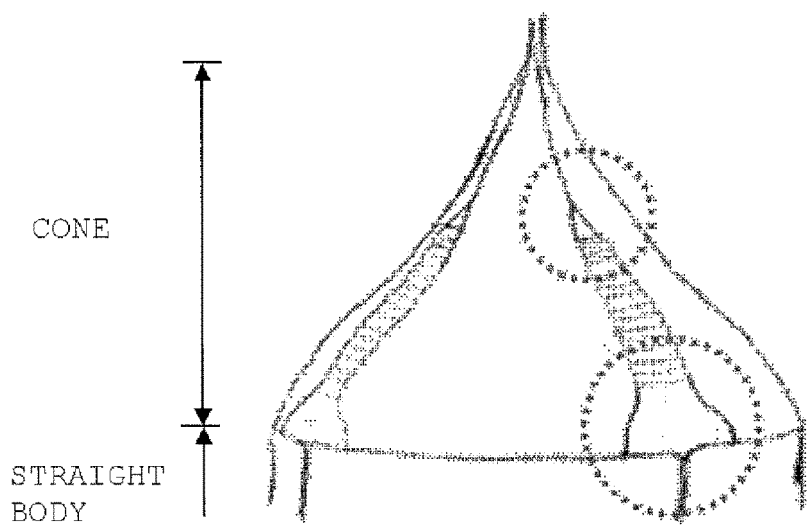
FIG. 3 is a schematic diagram of the shape of a cone and a straight body of a silicon single crystal obtained by a conventional single-crystal manufacturing method.

As shown in FIG. 3, a cone of a silicon single crystal manufactured by the conventional method is in the shape of a bowl. It is thought that a shape similar to this bowl shape is the most stable. The dislocations, however, are easy to be generated in an area in which a facet composed of a (111) face is formed. In FIG. 3, such areas are enclosed by circles. It is known that in manufacture of a single crystal having a crystal orientation of <100>, the (111) face is easiest to form when the taper angle is 35.2°.

The upper encircled erea in FIG. 3 is formed when the taper angle θ is increased by enlarging the diameter and approximated to 35.2° in the first half of the formation of the cone. Afterwards, the taper angle θ once exceeds 35.2°, and is then decreased in the second half of the formation of the cone. During this process, the other encircled area is formed when the taper angle θ is approximated to 35.2° again, as described later.

From these findings, the inventors have considered that reducing an area having a taper angle θ ranging from 25° to 45° allows the generation of dislocations to be inhibited, thereby bringing the invention to completion.

A single-crystal manufacturing apparatus usable for the inventive method of manufacturing a silicon single crystal will now be described.

Figure 1:
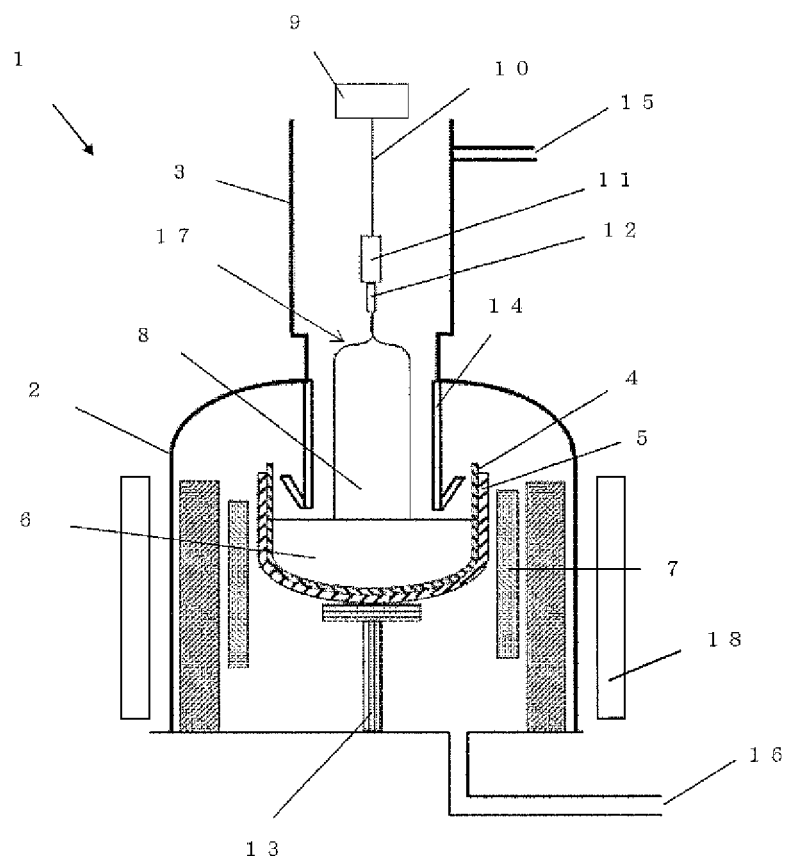
FIG. 1 is a schematic diagram of an exemplary single-crystal manufacturing apparatus for use in the implementation of the inventive method of manufacturing a single crystal.

As shown in FIG. 1, the single-crystal manufacturing apparatus 1 includes a main chamber 2, a pull chamber 3 that is disposed above and connected to the main chamber 2. The main chamber 2 accommodates crucibles 4 and 5, and a heater 7 to heat and melt raw material contained in the crucibles 4 and 5 into a melt 6 of the raw material.

A pulling mechanism 9 is disposed above the pull chamber 3 and configured to rotate and pull a grown single crystal 8. The pulling mechanism 9 disposed above the pull chamber 3 unreels a wire 10 of which one end is connected to a seed holder 11. The seed holder 11 holds a seed crystal 12 at its end. The single crystal 8 is grown under the seed crystal 12 by bringing the seed crystal 12 into contact with the melt 6 and winding up the wire 10 with the pulling mechanism 9.

The crucible 4 is made of quartz, disposed inside the crucible 5, and configured to directly contain the melt 6; the crucible 5 is made of graphite and configured to support the crucible 4 from the outside. These crucibles 4 and 5 are supported by a crucible rotating shaft 13 disposed at the lower part of the single-crystal manufacturing apparatus 1. The crucible rotating shaft 13 is rotatable and movable upward and downward. As the growth of the single crystal proceeds, the amount of the melt 6 in the crucible decreases. The melt level is always kept constant to prevent variation in crystal diameter and quality. More specifically, a crucible rotating and moving actuator (not shown) raises the crucibles 4 and 5 to compensate the decrease of the melt due to the growth of the silicon single crystal 8 while rotating the crucibles 4 and 5 in the opposite direction to the rotational direction of the silicon single crystal 8.

The single-crystal manufacturing apparatus 1 is also provided with a gas-flow guiding cylinder 14 configured to surround the silicon single crystal 8 to be grown. The gas-flow guiding cylinder 14 is made of graphite and thus can shield radiant heat from the heater 7 or the melt 6 toward the silicon single crystal 8.

An inert gas such as an argon gas is introduced into a furnace through a gas inlet 15 disposed at the upper part of the pull chamber 3 so that, for example, oxides created in the furnace are discharged to the exterior. The gas is guided to the vicinity of the grown silicon single crystal 8 by passing inside the gas-flow guiding cylinder 14, then passes through above the surface of the melt 6 and the upper end of the crucibles 4 and 5, and is discharged from a gas outlet 16 disposed at the lower part of the single-crystal manufacturing apparatus 1. This gas flow enables the silicon single crystal 8 to be cooled during the growth and prevents the accumulation of oxides on the inner side surface of the gas-flow guiding cylinder 14, the upper end of the crucibles 4 and 5, and so on.

The inventive method of manufacturing a silicon single crystal will be described below. This embodiment uses the single-crystal manufacturing apparatus 1 shown in FIG. 1 by way of example.

As shown in FIG. 1, raw material, high-purity polycrystalline silicon, is first heated to more than melting point (about 1420° C.) in the crucibles 4 and 5 by the heater 7 and melted to form the melt 6. At this time, a dopant such as antimony (Sb), arsenic (As), or phosphorus (P) is added to the melt 6. The amount of the dopant to be added is determined such that the resistivity of a single crystal to be manufactured is 0.05 Ωcm or less.

Next, the wire 10 is reeled out to bring the tip of the seed crystal 12 into contact with the melt at a substantially central position thereof (a seeding process). If necessary, this seeding process may include a necking process of forming a neck portion after dipping the seed crystal into the melt 6 so that dislocation generated in the crystal during the seeding process is removed.

While the crucible rotating shaft 13 is then rotated in a suitable direction, the wire 10 is rotated and wound up to pull up the seed crystal 12. The growth of the silicon single crystal 8 begins with these operation. In the crystal growth, the diameter of the silicon single crystal 8 to be manufactured is gradually enlarged to a desired diameter to form the cone 17.

Figure 2:
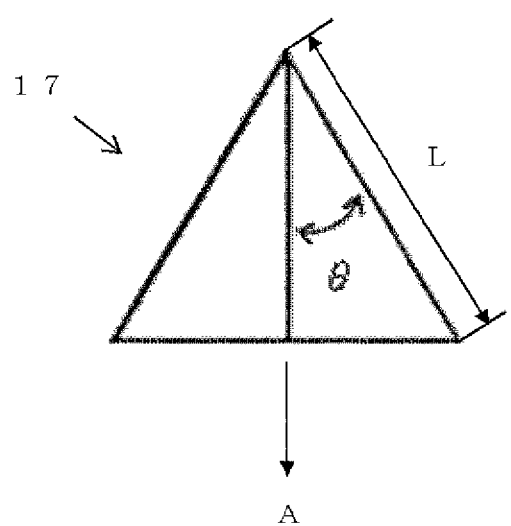
FIG. 2 is a schematic cross sectional view to represent the cone shape of a silicon single crystal.

FIG. 2 schematically shows the shape of the cone 17 when the cone is seen in the direction of the diameter of the silicon single crystal 8. As shown in FIG. 2, the taper angle formed between the growth direction A of the silicon single crystal and the side surface of the cone 17 is represented by θ, and the length of the side surface of the cone 17 is represented by L.

In the invention, the cone 17 is formed while the taper angle θ is adjusted such that the formed cone satisfies the following conditions: the sum total of the individual lengths of its divided areas each having a taper angle θ ranging from 25° to 45° is 20 percent or less of the length L of the side surface of the cone 17.

In this way, the area having a taper angle θ of 35.2° can be reduced during the formation of the cone 17. In other words, the inventive method can inhibit the formation of a (111) face, thereby enabling the inhibition of the generation of dislocations. The dislocations are easy to be generated on this (111) face.

The specific procedure for forming the cone 17 will now be described.

After the beginning of the cone formation, the temperature of the melt 6 is gradually decreased and the taper angle θ is gradually increased to enlarge the diameter. The diameter is preferably enlarged little by little. The reason is that since the volume of a crystallized portion and the heat capacity thereof are still small at this time, a rapid change in the temperature brings about a rapid change in the shape, resulting in the generation of dislocations.

As the crystal grows, the taper angle θ increases. When the taper angle θ reaches about 35.2°, each of four crystalline lines extending in a direction of <110> is divided into two lines, and the (111) face is formed between the divided two lines. The (111) face, which has a low surface energy, preferentially appears and becomes like a mirror.

In order to reduce an area including the (111) face as possible, the taper angle θ is adjusted so as to be less than 25°, or more than 45°. More specifically, the taper angle θ is preferably adjusted by decreasing the pulling rate of the silicon single crystal 8, or changing the rotational speed of the crucibles 4 and 5. Although the taper angle θ can also be adjusted by controlling the power of the heater 7 to change the temperature of the melt 6, that adjustment by the pulling rate or the rotational speed of the crucibles are easier to adjust the taper angle θ than this adjustment because there is a time lag until the taper angle θ varies due to the change in the temperature of the melt 6.

An exemplary procedure that can reduce a section in which the area having a taper angle θ ranging from 25° to 45° is formed, or a period therebetween includes sharply decreasing the pulling rate when the taper angle θ reaches, for example, about 25° and thereby increasing the taper angle θ. The pulling rate can be sharply changed unlike the change in the melt temperature due to the adjustment of the heater power. In addition, the adjustment of the pulling rate allows easy adjustment of the taper angle θ. From these facts, most preferably the taper angle θ is adjusted by the pulling rate. It is also effective to adjust the taper angle θ by sharply changing the pulling rate only in a given section during the cone formation. The same effect can be expected by the adjustment of the rotational speed of the crucibles, which is followed by the change in the melt temperature due to the change of the convection of the melt 6. This change of the convection rapidly varies the temperature of the vicinity of a solid-liquid interface, which exhibits much higher responsiveness than that of the change in the heater power. This temperature of the vicinity of the solid-liquid interface can be decreased by increasing the rotational speed of the crucibles for the CZ method, or decreasing the rotational speed of the crucibles for the MCZ method.

Increasing the taper angle θ particularly to more than 45° in this way eliminates the (111) face and permits the crystal to grow with this taper angle θ stably maintained. If the pulling rate is decreased as above, then the pulling rate may be returned to the pre-decrease value at this point of time. Even when the pulling rate is thus returned, the taper angle θ can stably be maintained. Accordingly, the reduction in the productivity is preferably inhibited in this way.

In the conventional method of manufacturing a heavily doped N-type silicon single crystal having a crystal orientation of <100>, a decreasing gradient of the melt temperature is made slight after the crystal diameter is close to a desired diameter in the second half of the cone formation so that the straight body is stably formed with a constant diameter at the beginning of its formation. This operation causes the taper angle θ to decrease and thereby approach 35.2° again, forming the (111) face also in this area, as described above. The conventional silicon-single-crystal manufacturing method is easy to generate dislocations also at a position just before the beginning of the formation of the straight body.

In contrast, the invention preferably decreases the pulling rate at this time to maintain a taper angle θ of more than 45° accordingly without decreasing the temperature of the melt. Instead of decreasing the pulling rate, the taper angle θ can also be adjusted to more than 45° by changing the rotational speed of the crucibles.

The inventive method can thus obtain a cone having fewer (111) faces, which means the generation of dislocations can be inhibited during the formation of the cone. The inventive method also can prevent the height of the cone from being too large, thereby inhibiting the reduction in the yield and productivity.

After the cone is formed, the straight body of the single crystal 8 is formed in a conventional way while the pulling rate of the single crystal 8 or the power of the heater 7 is adjusted to achieve a desired diameter and crystal quality. A tail is then formed to complete the manufacture of the silicon single crystal 8.

During the growth of the silicon single crystal, a magnetic field may be applied to the melt 6. As shown in FIG. 1, a horizontal magnetic field having a central magnetic field strength of 0.15 T or more may be then applied with a magnetic field applying apparatus 18 including, for example, a permanent magnet or an electromagnet.

In this manner, the convection of the melt in the crucible can be inhibited, and hence the variation in the temperature of the vicinity of the crystal growth interface can be reduced. The distribution of the concentration of dopant taken in the crystal can consequently be made uniform, and the introduction of point defects into the crystal can also be inhibited.

EXAMPLE

The present invention will be more specifically described below with reference to examples and comparative examples, but the present invention is not limited to these examples.

Example 1

An Sb-doped silicon single crystal having a crystal orientation of <100> and a diameter of 200 mm was manufactured with the single-crystal manufacturing apparatus shown in FIG. 1.

First, 180 kg of a polycrystalline silicon raw material was charged to a crucible having a diameter of 660 mm (26 inches), and was melted into a melt. A dopant, Sb, was added such that the resistivity of the silicon single crystal to be manufactured was 0.02 Ωcm at its top side.

After a neck was formed, the melt temperature was greatly decreased once, and then gradually decreased at a substantially constant proportion to start the formation of a cone. During these operation, the pulling rate was constant.

When the taper angle was approximated to 25°, the pulling rate was sharply decreased by 40%. The pulling rate was thereafter kept constant for a given time, and returned to the previous value after the taper angle exceeded 45°.

The growth of the single crystal was continued while the taper angle was held at more than 45°. When the diameter was approximated to a target value, the pulling rate was gradually decreased such that the taper angle was prevented from decreasing. The pulling rate was finally decreased to 40%. In this way, the taper angle was inhibited from being in the range from 25° to 45°, and the diameter of the straight body was prevented from being too large in the beginning of its formation.

Figure 4:
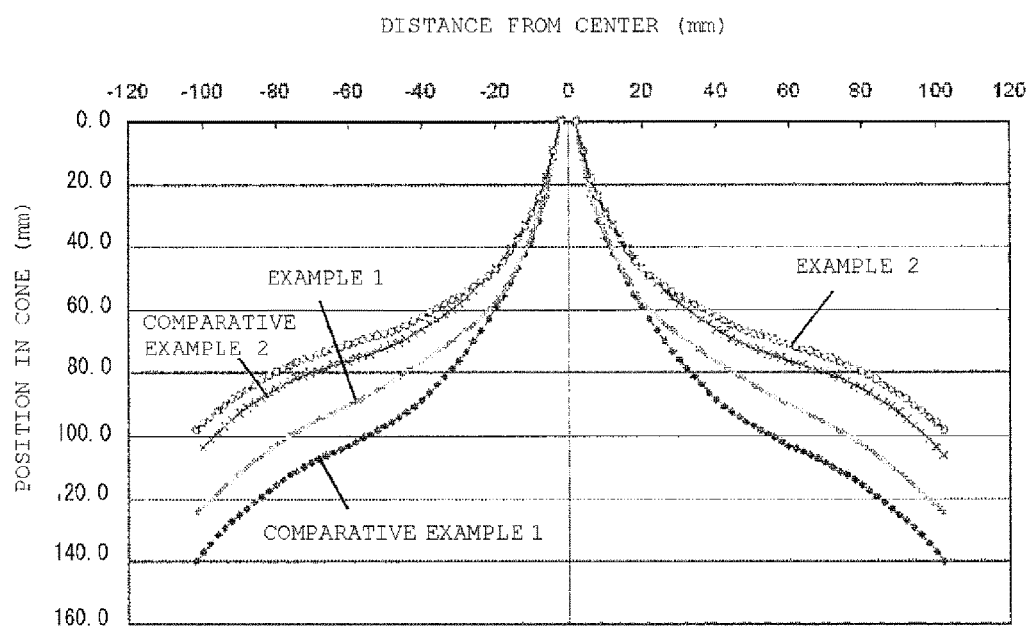
FIG. 4 is a graph showing the measurement result of the cone shape in examples 1 and 2, and comparative examples 1 and 2.
Figure 5:
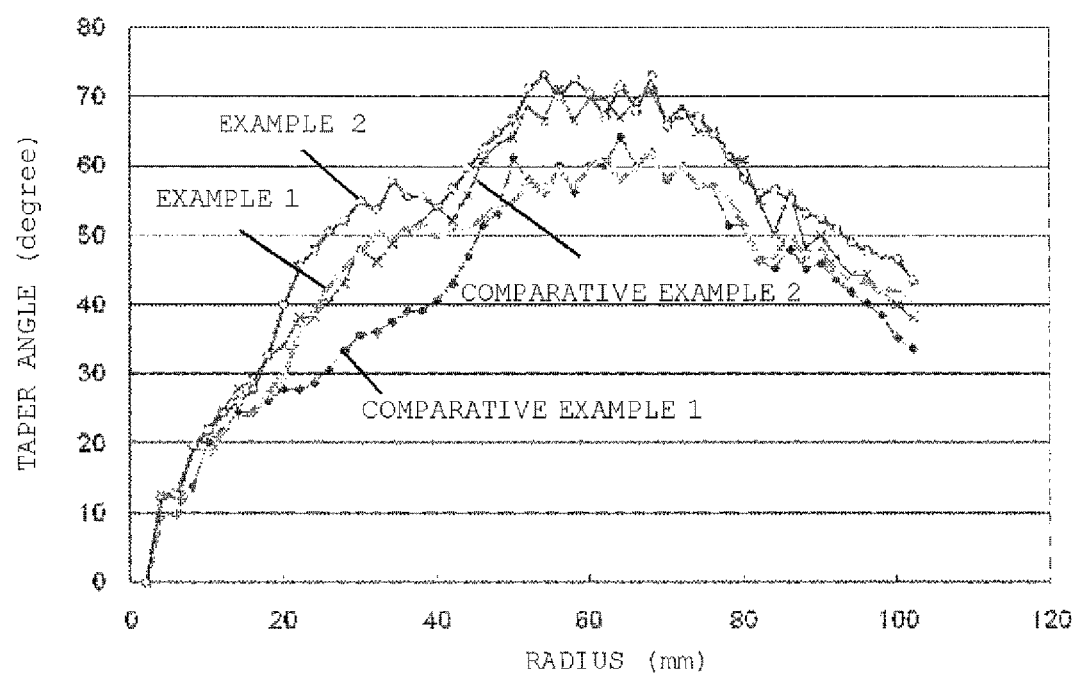
FIG. 5 is a graph showing the measurement result of the taper angle θ in examples 1 and 2, and comparative examples 1 and 2.

The shape and the taper angle θ of the cone thus formed were investigated. FIG. 4 shows the measurement result of the cone shape. FIG. 5 shows the measurement result of the taper angle θ with respect to the radius of the bottom of the cone during the cone formation. As shown in FIGS. 4 and 5, example 1 exhibited a smaller ratio of the total of the individual lengths of areas of the cone that have a taper angle θ ranging from 25° to 45° to the length L of the side surface of the cone, compared with comparative examples 1 and 2 described below. This ratio in example 1 was 20%.

Table 1 shows the incidence of the generation of dislocations during the cone formation. This incidence is represented by an index when the result in comparative example 1 was converted into 1. As shown in Table 1, the incidence of the generation of dislocations was one third or less of that in comparative example 1.

Example 2

A silicon single crystal was manufactured under the same conditions to make the same evaluation as in example 1 except that the decreasing gradient of the melt temperature was larger than that in example 1.

FIG. 4 shows the measurement result of the cone shape. FIG. 5 shows the measurement result of the taper angle θ with respect to the radius of the bottom of the cone during the cone formation.

As shown in FIGS. 4 and 5, the taper angle was larger than that in example 1 overall. In addition, example 2 exhibited a smaller ratio of the total of the individual lengths of areas of the cone that have a taper angle θ ranging from 25° to 45° to the length L of the side surface of the cone, compared with comparative examples 1 and 2 described below. This ratio in example 2 was 8%.

Table 1 shows the incidence of the generation of dislocations during the cone formation. As shown in Table 1, the incidence of the generation of dislocations was smaller than those in comparative examples 1 and 2, and approximately one third of that in comparative example 2.

All the dislocations generated in the cone in examples 1 and 2 were located at areas having a taper angle θ of less than 20° or more than 45°, which means these dislocations were generated due to cause except for the cone shape.

Above examples revealed that the inventive silicon-single-crystal manufacturing method can reliably inhibit the generation of dislocations by adjusting the taper angle θ such that the ratio of the total of the individual lengths of areas of the cone that have a taper angle θ ranging from 25° to 45° to the length L of the side surface of the cone is 20% or less.

Comparative Example 1

A silicon single crystal was manufactured under the same conditions to make the same evaluation as in example 1 except that the pulling rate was constant, that is, the taper angle θ was not adjusted at all.

FIG. 4 shows the measurement result of the cone shape. FIG. 5 shows the measurement result of the taper angle θ with respect to the radius of the bottom of the cone during the cone formation.

As shown in FIGS. 4 and 5, comparative example 1 exhibited a larger ratio of the total of the individual lengths of areas of the cone that have a taper angle θ ranging from 25° to 45° to the length L of the side surface of the cone, compared with examples 1 and 2. This ratio in comparative example 1 was 35%, which exceeded 20%.

Table 1 shows the incidence of the generation of dislocations during the cone formation. As shown in Table 1, the incidence of the generation of dislocations was more than three times larger than those in examples 1 and 2.

Comparative Example 2

A silicon single crystal was manufactured under the same conditions to make the same evaluation as in comparative example 1 except that the decreasing gradient of the melt temperature was larger than that in comparative example 1.

FIG. 4 shows the measurement result of the cone shape. FIG. 5 shows the measurement result of the taper angle θ with respect to the radius of the bottom of the cone during the cone formation.

As shown in FIGS. 4 and 5, the taper angle was larger than that in comparative example 1 overall. In addition, comparative example 2 exhibited a larger ratio of the total of the individual lengths of areas of the cone that have a taper angle θ ranging from 25° to 45° to the length L of the side surface of the cone, compared with examples 1 and 2. This ratio in comparative example 2 was 24%, which exceeded 20%. In addition, the diameter of the straight body became too large in the beginning of the formation, and was unstable.

Table 1 shows the incidence of the generation of dislocations during the cone formation. As shown in Table 1, the incidence of the generation of dislocations was more than 2.5 times larger than those in examples 1 and 2.

TABLE 1

| | COMPARATIVE EXAMPLE 1 | COMPARATIVE EXAMPLE 2 | EXAMPLE 1 | EXAMPLE 2 |
|---|---|---|---|---|
| INDEX OF GENERATION OF DISLOCATIONS | 1.00 | 0.83 | 0.33 | 0.28 |

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of manufacturing an N-type silicon single crystal having a resistivity of 0.05 Ωcm or less and a crystal orientation of <100> by a Czochralski method, comprising:

bringing a seed crystal into contact with a melt of raw material contained in a crucible, the melt being doped with a dopant;

forming a cone while changing and adjusting a taper angle θ such that a ratio of the total of individual lengths of areas each having a taper angle θ ranging from 25° to 45° to a length L of a side surface of the cone is 20% or less, the taper angle θ being formed between a growth direction of the silicon single crystal and the side surface of the cone when the cone is seen in a direction of a diameter of the silicon single crystal; and successively forming a straight body, wherein in a second half of the formation of the cone, the taper angle θ is held at more than 45° by either decreasing the pulling rate of the silicon single crystal, or changing the rotational speed of the crucible.

2. The method according to claim 1, wherein the dopant is any one of antimony (Sb), arsenic (As), and phosphorus (P).

3. The method according to claim 1, wherein the taper angle θ is adjusted by either decreasing a pulling rate of the silicon single crystal, or changing a rotational speed of the crucible when the cone is formed.

4. The method according to claim 2, wherein the taper angle θ is adjusted by either decreasing a pulling rate of the silicon single crystal, or changing a rotational speed of the crucible when the cone is formed.

5. The method according to claim 1, wherein during the growth of the silicon single crystal, a horizontal magnetic field having a central magnetic field strength of 0.15 T or more is applied to the melt.

6. The method according to claim 2, wherein during the growth of the silicon single crystal, a horizontal magnetic field having a central magnetic field strength of 0.15 T or more is applied to the melt.

7. The method according to claim 3, wherein during the growth of the silicon single crystal, a horizontal magnetic field having a central magnetic field strength of 0.15 T or more is applied to the melt.

8. The method according to claim 4, wherein during the growth of the silicon single crystal, a horizontal magnetic field having a central magnetic field strength of 0.15 T or more is applied to the melt.

* * * * *